United States Patent
Goto et al.

(10) Patent No.: US 7,342,063 B2
(45) Date of Patent: *Mar. 11, 2008

(54) AQUEOUS DISPERSION FOR ELECTRODEPOSITION, HIGH DIELECTRIC CONSTANT FILM AND ELECTRONIC PARTS

(75) Inventors: Hirofumi Goto, Tokyo (JP); Nobuyuki Ito, Tokyo (JP)

(73) Assignee: JSR Corporation, Tokyo (JP)

( * ) Notice: Subject to any disclaimer, the term of this patent is extended or adjusted under 35 U.S.C. 154(b) by 175 days.

This patent is subject to a terminal disclaimer.

(21) Appl. No.: 10/401,555

(22) Filed: Mar. 31, 2003

(65) Prior Publication Data

US 2003/0207135 A1    Nov. 6, 2003

Related U.S. Application Data

(62) Division of application No. 09/678,613, filed on Oct. 4, 2000, now Pat. No. 6,586,513.

(30) Foreign Application Priority Data

Oct. 6, 1999    (JP)    ................. 11-285904

(51) Int. Cl.
  *B32B 27/00*    (2006.01)
  *B32B 27/34*    (2006.01)
  *C08K 3/22*    (2006.01)
  *H01G 4/06*    (2006.01)

(52) U.S. Cl. ........... 524/399; 524/400; 524/403; 524/497; 428/473.5; 428/477.7

(58) Field of Classification Search ........... 204/489; 524/399, 400, 403, 497; 428/458, 473.5, 428/477.7, 474.4
See application file for complete search history.

(56) References Cited

U.S. PATENT DOCUMENTS 5,741,599 A    4/1998    Oie et al. ............ 428/458
5,770,642 A    6/1998    Kanato et al. ............ 523/404
5,905,109 A    5/1999    Shimizu et al. ............ 524/504
6,214,923 B1    4/2001    Goto et al. ............ 524/506
7,015,256 B2 *    3/2006    Ito et al. ............ 522/81

FOREIGN PATENT DOCUMENTS

| JP | 57-10663 | 1/1982 |
| JP | 57-70153 | 4/1982 |
| JP | 58-174421 | 10/1983 |
| JP | 7-268163 | 10/1995 |
| JP | 9-12742 | 1/1997 |
| JP | 9-208865 | 8/1997 |
| JP | 9-235495 | 9/1997 |
| JP | 10-60280 | 3/1998 |
| JP | 11-49951 | 2/1999 |
| JP | 11-60947 | 3/1999 |

OTHER PUBLICATIONS

Online Machine Translation of JP 0912742, Japan Patent Office, http://www19.ipdl.ncipi.go.jp/PA1/cgi-bin/PA1DETAIL , (Oct 2005) pp. 1-7.*

* cited by examiner

*Primary Examiner*—Daniel S. Metzmaier
(74) *Attorney, Agent, or Firm*—Oblon, Spivak, McClelland, Maier & Neustadt, P.C.

(57) ABSTRACT

A high dielectric constant film is prepared by electrodepositing a film from an aqueous dispersion comprising inorganic particles comprised of a compound selected from the group consisting of barium titanate, lead titanate, bismuth titanate, magnesium titanate and neodymium titanate, having a mean particle size of no greater than 1 μm and a dielectric constant of at least 30, and organic particles comprised of either or both of a polymerizable compound and a polymer, wherein the organic particles have a charge on the particle surfaces and fulfill at least one of the following conditions (i) and (ii)
  (i) said organic particles are composite particles of (A) organic solvent-soluble polyimide and (B) hydrophilic polymer, and
  (ii) the organic particles comprise composite particles of (C) polyamic and (D) hydrophobic compound.

15 Claims, No Drawings

AQUEOUS DISPERSION FOR ELECTRODEPOSITION, HIGH DIELECTRIC CONSTANT FILM AND ELECTRONIC PARTS

CROSS-REFERENCE TO RELATED APPLICATIONS

This application is a divisional application of application Ser. No. 09/678,613, filed Oct. 4, 2000, now U.S. Pat. No. 6,586,513.

BACKGROUND OF THE INVENTION

1. Field of the Invention

The present invention relates to an aqueous dispersion for electrodeposition, a high dielectric constant film formed from the aqueous dispersion and electronic parts provided with the high dielectric constant film.

2. Description of the Prior Art

A technique is known whereby a high dielectric constant layer is formed on a multilayer printed wiring board or the like and the layer is utilized as a condenser. The high dielectric constant layer is fabricated, for example, by a method in which a solution of a thermosetting resin in an organic solvent also containing an added high dielectric constant inorganic powder is impregnated into a fiber-reinforcement such as glass fibers to compensate for the fragility of the thermosetting resin, and the solvent is then scattered and allowed to harden.

Because this prior art method uses a fiber-reinforcement it is not possible to achieve significant reduction in the thickness of the high dielectric constant layer (for example, to under 50 μm), and since the dielectric constant of a fiber-reinforcement is lower than that of an inorganic powder such as $TiO_2$, it has not been possible to obtain condensers with high capacitance.

In order to solve this problem, Japanese Laid-open Patent Publication No. 12742 of 1997 discloses a high dielectric constant film that eliminates the need for the fiber-reinforcement in the aforementioned construction by using a thermosetting resin with film forming properties. According to this publication, a resin varnish is prepared containing the thermosetting resin and high dielectric constant inorganic powder, and this is coated and dried to produce a film.

However, since high dielectric constant inorganic powders usually have a high specific gravity and thus settle in resin varnishes with time, causing a lack of shelf life for such resin varnishes, it has been necessary to prepare a fresh resin varnish just before production of the film. Because the film is formed by coating and drying the solution, it is difficult to achieve a high film thickness precision for the obtained film, and the manageability has not been very good for formation of films on only specific locations of boards.

In addition, when forming a high dielectric constant layer selectively on a desired wiring, it has been necessary to prescribe the location of formation by a combination of photolithography and printing methods for conventional resin varnishes. However, formation methods using photolithography are associated with problems of high cost and complicated steps, while printing methods are associated with the problem of poor working precision.

SUMMARY OF THE INVENTION

[Problems to be Solved by the Invention]

It is an object of the present invention to provide an aqueous dispersion for electrodeposition which has excellent shelf life and can form thin, high dielectric constant films by electrodeposition, as well as a high dielectric constant film formed from the aqueous dispersion and electronic parts provided with the high dielectric constant film.

[Features of the Invention]

The present inventors have completed the present invention upon finding that the aforementioned problems can be overcome by using an aqueous dispersion for electrodeposition that comprises electrodepositable organic particles and small-sized inorganic particles dispersed in an aqueous medium.

That is, the aqueous dispersion for electrodeposition according to the first aspect of the invention is characterized by comprising inorganic particles with a mean particle size of no greater than 1 μm and a dielectric constant of at least 30, and organic particles composed of either or both a polymerizable compound and a polymer, dispersed in an aqueous medium. The aqueous dispersion is preferably used for electrodeposition to give a film with a dielectric constant of 6 or greater. The inorganic particles are preferably composed of a titanium-based metal oxide, and the organic particles are preferably charged on the particle surfaces and are composed of a polyimide-based resin. The volume ratio of the inorganic particles and organic particles is preferably in the range of 5/95-80/20.

The high dielectric constant film according to the second aspect of the invention is characterized by being formed by electrodeposition using the aqueous dispersion for electrodeposition according to the first aspect.

The electronic part according to the third aspect of the invention is characterized by being provided with a high dielectric constant film according to the second aspect.

[Effect of the Invention]

The aqueous dispersion for electrodeposition of the invention has excellent shelf life as explained above, and hence it is not necessary to prepare the solution for each high dielectric constant film fabrication. The aqueous dispersion of the invention can therefore enhance productivity for high dielectric constant films. Furthermore, since an aqueous medium is used unlike the varnish, an advantage is also provided in terms of the working environment. Since the high dielectric constant film of the invention is formed by electrodeposition using the aforementioned aqueous dispersion, the film thickness control is facilitated through adjustment of the electrodeposition conditions, while the film formability and follow-up properties to the substrate are superior to cases where the film is formed by application. It is also possible to form the high dielectric constant film selectively on a conductive substrate (wiring and the like), and to produce highly precise high dielectric constant films more inexpensively than by photolithography or printing methods. The high dielectric constant film of the invention has both low thickness and high dielectric constant, and can therefore be suitably used for such electronic parts as printed circuit boards, semiconductor packages, condensers and high-frequency antennas. Electronic parts of the invention provided with the aforementioned high dielectric constant film can be produced in miniature and thin-film form.

DETAILED DESCRIPTION OF THE INVENTION

The present invention will now be explained in further detail.

(1) Inorganic Particles

The dielectric constant of the inorganic particles used for the invention is 30 or greater, preferably 50 or greater and most preferably 70 or greater. The inorganic particles used are preferably composed of a metal oxide, and titanium-based metal oxides are particularly preferred. Here, "titanium-based metal oxides" means compounds including titanium element and oxygen element as essential elements. Specifically there may be mentioned metal oxides based on titanium dioxide, barium titanate, lead titanate, strontium titanate, bismuth titanate, magnesium titanate, neodymium titanate, calcium titanate and the like. Metal oxides based on "titanium dioxide" include titanium dioxide alone, as well as systems of titanium dioxide also containing small amounts of other added compounds, and they maintain the crystal structure of the major component of titanium dioxide; these conditions also apply to metal oxides of other systems. According to the invention, it is particularly preferred to use inorganic particles composed of titanium dioxide-based (rutile structure) or barium titanate-based metal oxides. For improved dispersability in aqueous media, particles composed of these materials having the particle surfaces modified with silica, alumina or the like are suitable for use.

The mean particle size of the inorganic particles must be no greater than 1 µm, preferably no greater than 0.5 µm and more preferably no greater than 0.2 µm. If the mean particle size exceeds 1 µm, the dispersability of the inorganic particles in aqueous media will be insufficient, making it impossible to achieve sufficient shelf life. There is no particular restriction for the minimum mean particle size, but it is normally 0.02 µm or greater.

(2) Organic Particles (2-1) Composition of Organic Particles

The organic particles used for the invention are composed of "either or both a polymerizable compound and a polymer". Here, "polymerizable compound" refers to a compound with a polymerizable group, and its meaning includes precursor polymers that have not been fully cured, polymerizable oligomers, monomers and the like. "Polymer" refers to a compound that has undergone substantially complete polymerization reaction. However, the polymer may also be crosslinked after electrodeposition, by heating, moisture or the like. The surfaces of the organic particles are preferably charged to allow electrodeposition. The surface charge may be anionic or cationic, but is preferably cationic in order to prevent electrode oxidation during the electrodeposition.

The organic particles are preferably composed of one, two or more types selected from among polyimide-based resins, epoxy-based resins, acrylic-based resins, polyester-based resins, fluorine-based resins and silicone-based resins. They may also contain other components in addition to these resins. The resins may also be chemically bonded each other or to other components.

According to the invention it is possible to form a high dielectric constant film with excellent mechanical properties, chemical properties and electrical properties by electrodeposition, and therefore it is particularly preferred to use organic particles composed mainly of a polyimide-based resin. "Polyimide-based resin" means a precursor polymer (such as polyamic acid and the like) that can be cured by heating or the like after electrodeposition, a monomer that can be used to form a polyimide-based resin, or an oligomer or the like, and this applies to the other resins as well. The "polyimide-based resin" also includes polyimide resins or their precursors, copolymer resins or precursor polymers of monomers that can be used to form polyimide resins and other monomers, and reaction products of polyimide resins or their precursors with other compounds; this also applies to the other resins.

(2-2) Aqueous Emulsion of Organic Particles

The aqueous dispersion of the invention is normally prepared using an aqueous emulsion wherein the organic particles are dispersed in an aqueous medium. The water content of the aqueous medium is usually at least 5 wt %, preferably at least 10 wt %, more preferably 20-98 wt % and most preferably 30-95 wt %. As other media that may be used with water depending on the case there may be mentioned aprotic polar solvents used for the production of polyamic acids or polyimides, as well as esters, ketones, phenols, alcohols and the like.

The following explanation will concern a method for production of an aqueous emulsion of organic particles composed mainly of a polyimide-based resin (hereunder referred to as "polyimide-based resin emulsion"), an aqueous emulsion of particles composed mainly of an epoxy-based resin (hereunder, "epoxy-based resin emulsion"), an aqueous emulsion of particles composed mainly of an acrylic-based resin (hereunder, "acrylic-based resin emulsion"), an aqueous emulsion of particles composed mainly of a polyester-based resin (hereunder, "polyester-based resin emulsion"), an aqueous emulsion of particles composed mainly of a fluorine-based resin (hereunder, "fluorine-based resin emulsion") and an aqueous emulsion of particles composed mainly of a silicone-based resin (hereunder, "silicone-based resin emulsion").

(2-2-i) Method for Production of Polyimide-based Resin Emulsion

The organic particles of the invention are preferably composed of a polyimide-based resin to allow formation of a polyimide-based high dielectric constant film with excellent mechanical properties, chemical properties and electrical properties. As preferred methods for fabrication of a polyimide-based film by electrodeposition there may be mentioned the following two methods.

[1] A method in which a polyimide-based resin emulsion comprising composite particles of (A) an organic solvent-soluble polyimide and (B) a hydrophilic polymer is used as the electrodeposition solution for electrodeposition of the composite particles.

[2] A method in which a polyimide-based resin emulsion comprising particles including composite particles of (C) a polyamic acid and (D) a hydrophobic compound is used as the electrodeposition solution for electrodeposition of the particles, and the electrodeposited polyamic acid is heated for dehydration ring closure.

As methods for production of the polyimide-based resin emulsion used for this method, there may be mentioned the method described in Japanese Laid-open Patent Publication No. 49951 of 1999 for method [1], and the method described in Japanese Laid-open Patent Publication No. 60947 of 1999 for method [2].

The method for production of the polyimide-based resin emulsion to be used in method [1] will now be explained in greater detail.

The method for synthesis of the "(A) organic solvent-soluble polyimide" is not particularly restricted, and for example, the polyimide may be synthesized by mixing a tetracarboxylic dianhydride and a diamine compound in an organic polar solvent for polycondensation to obtain a polyamic acid, and then subjecting the polyamic acid to heating imidation or chemical imidation to promote a dehydrating ring closure reaction. Alternatively, polycondensation of the tetracarboxylic dianhydride and the diamine compound may be carried out in multiple stages to synthesize a polyimide with a block structure.

The organic solvent-soluble polyimide is preferably one with at least one type of reactive group (a) such as a carboxyl group, amino group, hydroxyl group, sulfonic acid group, amido group, epoxy group or isocyanate group. As a method for synthesis of the polyimide with the reactive group (a)

there may be mentioned, for example, a method whereby a carboxylic acid dianhydride, diamine compound, carboxyl acid monoanhydride, monoamine compound or the like which has the reactive group (a) is used for synthesis of the polyamic acid, and the reactive group (a) is left after the dehydration ring closure reaction.

The "(B) hydrophilic polymer" comprises a hydrophilic polymer having at least one from among amino groups, carboxyl groups, hydroxyl groups, sulfonic acid groups, amido groups and the like, as the hydrophilic group, and having a solubility in water at 20° C. of normally 0.01 g/100 g or greater, and preferably 0.05 g/100 g or greater. In addition to the hydrophilic group, it also preferably has one or more reactive groups (b) that can react with the reactive group (a) in component (A). As examples of such reactive groups (b) there may be mentioned epoxy groups, isocyanate groups and carboxyl groups, as well as the same hydrophilic groups mentioned above. This type of hydrophilic polymer may be obtained either by homopolymerization or copolymerization of monovinyl monomers having the hydrophilic group and/or the reactive group (b), or by copolymerization of such monovinyl monomers with other monomers.

The (A) organic solvent-soluble polyimide and the (B) hydrophilic polymer are selected so that the reactive group (a) and the reactive group (b) in the hydrophilic polymer are combined with the appropriate reactivity and the polyimide and hydrophilic polymer are, for example, mixed in a dissolved state in an organic solvent for reaction, with heating if necessary, after which the reaction solution is combined with an aqueous medium with optional removal of at least a portion of the organic solvent, to obtain a polyimide-based resin emulsion comprising composite particles wherein the polyimide and the hydrophilic polymer are bonded together in the same particles.

The method for production of the polyimide-based resin emulsion using the method of [2] above will now be explained in fuller detail.

The method of synthesizing the "(C) polyamic acid" as the polyimide precursor is not particularly restricted, and for example, the polyamic acid may be obtained by polycondensation reaction of a tetracarboxylic dianhydride and diamine compound in an organic polar solvent. Alternatively, polycondensation reaction of the tetracarboxylic dianhydride and the diamine compound may be carried out in multiple stages to synthesize a polyamic acid with a block structure. A polyamic acid that is partially imidated by dehydration ring closure of the polyamic acid may also be used.

The "(D) hydrophobic compound" is a compound with a group that can react with at least the amic acid group of the polyamic acid (hereunder referred to as "reactive group"). As examples for the reactive group there may be mentioned epoxy, isocyanate, carbodiimide, hydroxyl, mercapto, halogen, alkylsulfonyl, arylsulfonyl, diazo and carbonyl groups. One or more of these reactive groups may be present in the hydrophobic compound. "Hydrophobic" means that its solubility in water at 20° C. is normally less than 0.05 g/100 g, preferably less than 0.01 g/100 g, and more preferably less than 0.005 g/100 g.

As examples of such hydrophobic compounds there may be used one or more types selected from among epoxified polybutadiene, bisphenol A-based epoxy resins, naphthalene-based epoxy resins, fluorene-based epoxy resins, biphenyl epoxy resins, glycidyl ester epoxy resins, acryl glycidyl ether, glycidyl (meth)acrylate, 1,3,5,6-tetraglycidyl-2,4-hexanediol, N,N,N',N'-tetraglycidyl-m-xylenediamine, tolylene diisocyanate, dicyclohexyl carbodiimide, polycarbodiimide, cholesterol, benzyl alcohol, p-toluenesulfonic acid esters, ethyl chloroacetate, triazinetrithiol, diazomethane, diacetone (meth)acrylamide and the like.

The (C) polyamic acid and (D) hydrophobic compound are, for example, mixed in a dissolved state in an organic solvent, after which the reaction solution is combined with an aqueous medium with optional removal of at least a portion of the organic solvent, to obtain a polyimide-based resin emulsion comprising composite particles containing the polyamic acid and the hydrophobic compound in the same particles.

The tetracarboxylic dianhydride used for the method of [1] and [2] above is not particularly restricted, and as examples there may be mentioned aliphatic tetracarboxylic dianhydrides and alicyclic tetracarboxylic dianhydrides such as butanetetracarboxylic dianhydride, 1,2,3,4-cyclobutane-tetracarboxylic dianhydride, 3,3',4,4'-dicyclohexyltetracarboxylic dianhydride, 2,3,5-tricarboxycyclopentylacetic dianhydride and 1,3,3a,4,5,9b-hexahydro-5-(tetrahydro-2,5-dioxo-3-furanyl)-naphtho[1,2-c]-furan-1,3-dione;

aromatic tetracarboxylic dianhydrides such as pyromellitic dianhydride, 3,3',4,4'-benzophenonetetracarboxylic dianhydride and 3,3',4,4'-biphenylsulfonetetracarboxylic dianhydride; and the like. These tetracarboxylic dianhydrides may be used alone or in combinations of two or more.

The diamine compound used for the method of [1] or [2] above is not particularly restricted, and as examples there may be mentioned aromatic diamines such as p-phenylenediamine, 4,4'-diaminodiphenylmethane and 2,2-bis[4-(4-aminophenoxy)phenyl] propane;

aliphatic diamines and alicyclic diamines such as 1,1-metaxylylenediamine, 1,3-propanediamine, tetramethylenediamine and 4,4'-methylenebis(cyclohexylamine);

diamines with two primary amino groups and a nitrogen atom other than that of the primary amino groups in the molecule, such as 2,3-diaminopyridine, 2,4-diamino-6-dimethylamino-1,3,5-triazine, 2,4-diamino-5-phenylthiazole and bis(4-aminophenyl)phenylamine;

mono-substituted phenylenediamines; and diaminoorganosiloxanes. These diamine compounds may be used alone or in combinations of two or more.

(2-2-ii) Method for Production of Epoxy-based Resin Emulsion

The method for production of an epoxy-based resin emulsion is not particularly restricted, and any conventional publicly known method may be used such as the method described in Japanese Laid open Patent Publication No. 235495 of 1997 or No. 208865 of 1997, for example.

(2-2-iii) Method for Production of Acrylic-based Resin Emulsion

The method for production of an acrylic-based resin emulsion is not particularly restricted, and for example, it may be produced by a common emulsion polymerization method. As the monomers there may be used one, two or more types selected from among common acrylic-based and/or methacrylic-based monomers. Here, the particles are preferably rendered electrodepositable by copolymerization with a monomer with a cationic group such as an amino, amido or phosphono group or a monomer with an anionic group such as a carboxyl or sulfonic acid group, and the copolymerization degree is preferably 5-80 wt % (more preferably 10-50 wt %) with respect to the total monomer used. As specific examples of monomers with such amino groups there are preferably used dimethylaminoethyl acrylate and dimethylamino propylacrylamide.

(2-2-iv) Method for Production of Polyester-based Resin Emulsion

The method for production of a polyester-based resin emulsion is not particularly restricted, and any conventional publicly known method may be used such as the method described in Japanese Laid-open Patent Publication No. 10663 of 1982, No. 70153 of 1982 or No. 174421 of 1983, for example.

(2-2-v) Method for Production of Fluorine-based Resin Emulsion

The method for production of a fluorine-based resin emulsion is not particularly restricted, and any conventional publicly known method may be used such as the method described in Japanese Laid-open Patent Publication No. 268163 of 1995, for example.

(2-2-vi) Method for Production of Silicone-based Resin Emulsion

The method for production of a silicone-based resin emulsion is not particularly restricted, and any conventional publicly known method may be used such as the method described in Japanese Laid-open Patent Publication No. 60280 of 1998.

(3) Aqueous Dispersion

The aqueous dispersion of the invention is one in which the aforementioned organic particles and inorganic particles are dispersed in an aqueous medium. The meaning of "aqueous medium" is the same as given above.

The volume ratio of the inorganic particles and organic particles in the aqueous dispersion is preferably in the range of 5/95-80/20, and more preferably 10/90-60/40. When the inorganic particle proportion is less than 5 vol %, it becomes difficult to obtain a high dielectric constant film. On the other hand, when the proportion of inorganic particles exceeds 80 vol %, the film forming properties of the film are undesirably inadequate.

The pH of the aqueous dispersion is preferably 2-10 (more preferably 3-9), the solid content is preferably 1-50 wt % (more preferably 5-20 wt %), and the viscosity at 20° C. is preferably 1-100 mPa·s. If the pH, solid content or viscosity fall outside of these specified ranges, the dispersability of the particles is reduced leading to a lack of shelf life, and the manageability during handling and use is often impaired.

The aqueous dispersion may be prepared by a method whereby [1] an aqueous dispersion of the inorganic particles is mixed with an aqueous dispersion of the organic particles, or [2] the inorganic particles are added to and mixed with an aqueous dispersion of the organic particles. Method [1] is preferred. The pH of the aqueous dispersion of the inorganic particles before its mixture with the aqueous dispersion of the organic particles is preferably adjusted to pH 2-10 using nitric acid, sulfuric acid, potassium hydroxide or the like in order to improve the stability during mixing.

The aqueous dispersion of the invention may have a shelf life which allows storage for a period of 5 days or longer (preferably 7 days or longer, more preferably 10 days or longer, and especially 14 days or longer) at 20° C., without causing bilayer separation or notable changes in viscosity.

The aqueous dispersion of the invention may also contain, in addition to the aforementioned organic particles and inorganic particles, also at least one selected from among organosilanes represented by the following formula (1), hydrolysates in which a portion or all of the hydrolyzable groups of the organosilane have been hydrolyzed, and partial condensates in which the hydrolysate has been partially dehydrated and condensed (hereunder referred to as "organosilane condensate and the like"). The film formed from the aqueous dispersion for electrodeposition has excellent mechanical properties, chemical properties, hardness and electrical properties due to crosslinking of the organosilane condensates and the like in the film, particularly when heat curing is carried out after electrodeposition.

$$(R^1)_n Si(OR^2)_{4-n} \tag{1}$$

where $R^1$ represents a hydrogen atom or a monovalent organic group of 1-8 carbons, $R^2$ represents an alkyl group of 1-5 carbons, an acyl group of 1-6 carbons or a phenyl group, and n is an integer of 1 or 2. $R^1$ and $R^2$ may be the same or different.

As organic groups of 1-8 carbons for $R^1$ in formula (1) there may be mentioned linear or branched alkyl groups, halogen-substituted alkyl groups, vinyl groups, phenyl groups and 3,4-epoxycyclohexylethyl groups. $R^1$ may also have a carbonyl group. $R^1$ is preferably an alkyl group of 1-4 carbons or a phenyl group.

As alkyl groups of 1-5 carbons or acyl groups of 1-6 carbons for $R^2$ there may be mentioned methyl, ethyl, n-propyl, isopropyl, n-butyl, isobutyl, sec-butyl, tert-butyl, n-pentyl, acetyl, propionyl and butyryl. $R^2$ is preferably an alkyl group of 1-4 carbons.

As examples of preferably used organosilanes there may be mentioned dimethyldimethoxysilane, dimethyldiethoxysilane, isobutyltrimethoxysilane and phenyltriethoxysilane. These organosilanes may be used alone or in combinations of two or more.

The "organosilane condensate and the like" preferably form composite-style particles with organic particles in the aqueous dispersion for electrodeposition according to the invention. For the "composite-style particles", the compound composing the organic particles and the organosilane condensate and the like are chemically bonded, or the organosilane condensate and the like is adhered to the surface or inside of the organic particles.

The organosilane condensate and the like is used in an amount of preferably 0.1-500 parts by weight and more preferably 0.5-250 parts by weight to 100 parts by weight of the organic particles. If the organosilane condensate and the like is used at less than 0.1 part by weight it may not be possible to achieve the desired effect, while if it is used at greater than 500 parts by weight the film will tend to have lower adherence.

The composite-style particles may be produced by either of the following methods [1] or [2]. The methods may also be used in combination.

[1] The organosilane is added to the organic particle emulsion for absorption of at least a portion of the organosilane into the organic particles, followed by progressive hydrolysis reaction and condensation reaction of the organosilane.

[2] A reaction is conducted in which the organic particles are produced in the presence of the organosilane condensate and the like dispersed in the aqueous medium.

For absorption of the organosilane into the organic particles by method [1], the organosilane may be added to the emulsion and adequately stirred. At this stage, at least 10 wt % (more preferably at least 30 wt %) of the added organosilane is absorbed into the particles. In order to avoid progression of the hydrolysis/condensation reaction of the organosilane before absorption has sufficiently been accomplished, the pH of the reaction system may be adjusted to normally 4-10, preferably 5-10 and more preferably 6-8. The treatment temperature for absorption of the organosilane into the organic particles is preferably 70° C. or below, more preferably 50° C. or below and even more preferably 0-30° C. The treatment time is normally 5-180 minutes, with about 20-60 minutes being preferred.

The temperature for the hydrolysis/condensation of the absorbed organosilane is normally 30° C. or above, preferably 50-100° C. and more preferably 70-90° C., with the preferred polymerization time being 0.3-15 hours, and more preferably 1-8 hours.

For method [2], the organosilane is mixed in an aqueous solution of a strongly acidic emulsifying agent such as an alkylbenzenesulfonic acid using a homomixer or an ultrasonic mixer, and then subjected to hydrolysis/condensation to obtain an organosilane condensate and the like dispersed in the aqueous medium. The aforementioned organic particles are produced preferably by emulsion polymerization in the presence of the organosilane condensate and the like.

(4) High Dielectric Constant Film

The aqueous dispersion of the invention may be used directly or it may be diluted or concentrated, with addition of appropriate publicly known additives if necessary, used as an electrodeposition solution for formation of a high dielectric constant film. A common electrodeposition method using the electrodeposition solution may be employed for electrodeposition of the inorganic particles and organic particles in the aqueous dispersion onto an electrode surface or the like, to produce a high dielectric constant film.

For production of a high dielectric constant film according to the invention, the resin components of the electrodeposited particles are preferably heat cured. The heat curing conditions are not particularly restricted, but the heating temperature is preferably 100-400° C. and more preferably 150-300° C. The heating time is preferably 5 minutes or longer, and more preferably 10 minutes or longer.

An aqueous dispersion according to the invention can give a high dielectric constant film with a dielectric constant of 6 or greater (more preferably 7 or greater). It can exhibit a volume resistivity of $10^{12}$ Ω·cm or greater (preferably $10^{13}$ Ω·cm or greater). The thickness of the high dielectric constant film is preferably no greater than 50 µm (more preferably no greater than 30 µm). The lower limit for the film thickness is not particularly restricted, but normally it is at least 1 µm.

(5) Electronic Parts

A high dielectric constant film according to the invention can be used to form thin, high capacitance condensers. Electronic parts such as printed circuit boards, semiconductor packages, condensers and high-frequency antennas provided with such high dielectric constant films can be built to small sizes and high integration.

EMBODIMENTS OF THE INVENTION

The present invention will now be explained in further detail by way of examples and comparative examples. In the explanation which follows, the terms "parts" and "%" are based on weight, unless otherwise specified.

(1) Preparation of Inorganic Particle Dispersion and Organic Particle Emulsion

SYNTHESIS EXAMPLE 1

Titanium Oxide Aqueous Dispersion "a"

After mixing 200 g of titanium oxide particles composed mainly of titanium dioxide with a rutile structure (product name: "STR-60C", mean particle size: 0.1 µm, dielectric constant: 105, product of Sakai Chemicals Co., Ltd.) and 80 g of ion-exchanged water in a homomixer, the pH was adjusted to 4 with nitric acid, and ultrasonic dispersion was carried out for 10 minutes to obtain a titanium oxide aqueous dispersion with no aggregation (solid content: 20%).

SYNTHESIS EXAMPLE 2

Titanium Oxygen Aqueous Dispersion "b"

After mixing 200 g of titanium oxide particles composed mainly of titanium dioxide with a rutile structure (product name: "TTO-55", mean particle size: 0.2 µm, dielectric constant: 110, product of Ishihara Industries Co, Ltd.) and 80 g of ion-exchanged water in a homomixer, the pH was adjusted to 3 with nitric acid, and ultrasonic dispersion was carried out for 10 minutes to obtain a titanium oxide aqueous dispersion with no aggregation (solid content: 20%).

SYNTHESIS EXAMPLE 3

Barium Titanate Aqueous Dispersion

After mixing 200 g of barium titanate particles (product name: "BT-02", mean particle size: 0.2 µm, dielectric constant: 2000, product of Sakai Chemicals Co, Ltd.) and 80 g of ion-exchanged water in a homomixer, the pH was adjusted to 3 with nitric acid, and ultrasonic dispersion was carried out for 10 minutes to obtain a barium titanate aqueous dispersion with no aggregation (solid content: 20%).

SYNTHESIS EXAMPLE 4

Polyimide-based Resin Emulsion

After dissolving 32.29 g (90 millimoles) of 3,3',4,4'-diphenylsulfonetetracarboxylic dianhydride and 3.00 g (10 millimoles) of 1,3,3a,4,5,9b-hexahydro-5-(tetrahydro-2,5-dioxo-3-furanyl)-naphtho[1,2-c]-furan-1,3-dione as tetracarboxylic dianhydrides and 36.95 g (90 millimoles) of 2,2-bis[4-(4-aminophenoxy)phenyl]propane and 2.49 g (10 millimoles) of organosiloxane "LP7100" (product of Shinetsu Chemicals Corp.) as diamine compounds in 450 g of N-methyl-2-pyrrolidone, the solution was reacted at room temperature for 12 hours. Next, 32 g of pyridine and 71 g of acetic anhydride were added to the reaction solution, and dehydration ring closure reaction was conducted at 100° C. for 3 hours. The reaction solution was distilled under reduced pressure for purification to obtain a polyimide solution with a solid content of 10%.

The reaction vessel housing 100 parts of diethyleneglycol monoethyl ether was held at 85° C. in a nitrogen gas atmosphere, and then a mixed solution comprising 65 parts of n-butyl acrylate, 30 parts of dimethylaminoethyl acrylate, 5 parts of glycidyl methacrylate and 1 part of azobisisobutyronitrile was continuously added over a period of 5 hours and stirred for solution polymerization. After completion of the dropwise addition, the stirring was continued at 85° C. for 2 hours for thorough solution polymerization, to obtain an acryl polymer solution with a solid content of 50%.

After mixing 50 parts (as solid content) of a polyimide solution, 30 parts (as solid content) of the acryl polymer solution and 20 parts of "Epikote 828" (product of Yuka Shell Epoxy Corp.) and conducting reaction at 70° C. for 3 hours, 3 parts of acetic acid was slowly added and mixed therewith for adjustment of the pH. Next, 1000 parts of distilled water was slowly added and forcefully mixed therewith to obtain a cationic emulsion of organic particles composed mainly of a polyimide-based resin.

SYNTHESIS EXAMPLE 5

Epoxy-based Resin Emulsion

After mixing 46.3 parts of a block isocyanate comprising tolylene diisocyanate and 2-ethylhexanol and 89.3 parts of an epoxyamine addition product obtained by reacting "Epikote 828" (product of Yuka Shell Epoxy Corp.) with diethylamine, 3.8 parts of acetic acid was added as a pH adjustor. The mixture was charged into 1200 parts of ion-exchanged water while stirring, to obtain a cationic emulsion of organic particles composed mainly of an epoxy-based resin precursor.

SYNTHESIS EXAMPLE 6

Polyester-based Resin Emulsion

In a reactor there were charged 466 parts of dimethyl terephthalate, 388 parts of dimethyl isophthalate, 178 parts of dimethyl 5-sodiumsulfoisophthalate, 443 parts of ethylene glycol, 400 parts of neopentyl glycol, 0.44 part of zinc acetate, 0.04 part of sodium acetate and 0.43 part of antimony trioxide, and ester exchange reaction was carried out at 140-220° C. for 4 hours. Polycondensation reaction was then conducted for one hour at 260° C. under a vacuum of 20 mmHg to obtain a polyester-based resin.

30 parts of the polyester-based resin was added to a mixed solution of 14 parts of isopropanol and 56 parts of water, and dispersion was carried out at 70-75° C. over a period of 3 hours to obtain an emulsion of cationic organic particles composed mainly of a polyester-based resin polymer.

SYNTHESIS EXAMPLE 7

Barium Titanate Alcohol Dispersion

After mixing 150 parts of barium titanate particles (product name: "HPBT-1", mean particle size: 0.6 μm, dielectric constant: 2000, product of Fuji Titanium Industries Co, Ltd.) and 850 parts of isopropyl alcohol with a homomixer, the mixture was further dispersed with an ultrasonic disperser to obtain a barium titanate alcohol dispersion with no aggregation (solid content: 15%).

(2) Preparation of Aqueous Dispersions

EXAMPLE 1

An aqueous dispersion was prepared by mixing 200 parts (40 parts in terms of solid content) of the titanium oxide aqueous dispersion "a" obtained in Synthesis Example 1 and 1200 parts (60 parts in terms of solid content) of the polyimide-based resin emulsion obtained in Synthesis Example 4.

EXAMPLE 2

An aqueous dispersion was prepared by mixing 250 parts (50 parts in terms of solid content) of the titanium oxide aqueous dispersion "b" obtained in Synthesis Example 2 and 1000 parts (50 parts in terms of solid content) of the polyimide-based resin emulsion obtained in Synthesis Example 4.

EXAMPLE 3

An aqueous dispersion was prepared by mixing 150 parts (30 parts in terms of solid content) of the barium titanate aqueous dispersion obtained in Synthesis Example 3 and 1400 parts (70 parts in terms of solid content) of the polyimide-based resin emulsion obtained in Synthesis Example 4.

EXAMPLE 4

An aqueous dispersion was prepared in the same manner as Example 2 except that the epoxy-based resin emulsion obtained in Synthesis Example 5 was used instead of the polyimide-based resin emulsion.

EXAMPLE 5

An aqueous dispersion was prepared in the same manner as Example 2 except that the polyester-based resin emulsion obtained in Synthesis Example 6 was used instead of the polyimide-based resin emulsion.

EXAMPLE 6

An aqueous dispersion was prepared by mixing 300 parts (45 parts in terms of solid content) of the barium titanate alcohol dispersion obtained in Synthesis Example 7 and 220 parts (11 parts in terms of solid content) of the polyimide-based resin emulsion obtained in Synthesis Example 4.

EXAMPLE 7

An aqueous dispersion was prepared by mixing 300 parts (45 parts in terms of solid content) of the barium titanate alcohol dispersion obtained in Synthesis Example 7 and 100 parts (5 parts in terms of solid content) of the polyimide-based resin emulsion obtained in Synthesis Example 4.

COMPARATIVE EXAMPLE 1

The titanium oxide aqueous dispersion obtained in Synthesis Example 1 was used directly as an aqueous dispersion.

COMPARATIVE EXAMPLE 2

A film forming varnish was obtained by adding and mixing 40 parts of the titanium oxide particles used in Synthesis Example 1 with 600 parts (60 parts in terms of solid content) of a polyimide-based resin varnish (product name: "Upifine ST", product of Ube Kosan Co, Ltd.)

(3) Film Formation and Performance Evaluation

After situating a copper plate as the cathode and an SUS plate as the opposing electrode in each of the aqueous dispersions of Examples 1-5 and Comparative Example 1, the particles were electrodeposited onto the copper plate cathodes with a constant voltage of 10 V. Heating was then performed at 100° C. for 10 minutes and then at 250° C. for 30 minutes to obtain a film with a thickness of 20 μm. No film was obtainable in Comparative Example 1 because of poor film formability.

The varnish of Comparative Example 2 was also applied onto the copper plate and heated at 100° C. for 10 minutes and then at 250° C. for 30 minutes to obtain a film with a thickness of 20 μm.

The shelf life of the aqueous dispersions or varnishes of Examples 1-5 and Comparative Examples 1 and 2 were evaluated by the methods described below. The performance of the films obtained by electrodeposition was also evaluated by the methods described below. The results are shown in Tables 1 and 2.

[Shelf Life]

The aqueous dispersion or varnish was placed in a plastic bottle and stored at 20° C. for 10 days, upon which the dispersion state and viscosity were visually observed. The evaluation results are indicated according to the following scale.

○: No change in viscosity or dispersion state x: Separation into two layers

[Dielectric Constant, Dielectric Loss Tangent and Volume Resistivity]

These were measured according to JIS K6481.

[Moist Heat Resistance (HAST Test)]

The cured film was subjected to a moist heat resistance test for 72 hours under conditions of 121° C., 100% humidity, 2 atm, and infrared spectrometry was conducted before and after the test; based on the degree of change, the moist heat resistance was evaluated according to the following scale:

○: No change, high resistance x: Large change, low resistance

TABLE 1

|  | Example 1 | Example 2 | Example 3 | Example 4 | Example 5 |
|---|---|---|---|---|---|
| Inorganic Particles |  |  |  |  |  |
| Particle material | $TiO_2$ | $TiO_2$ | $BaTiO_3$ | $TiO_2$ | $TiO_2$ |
| Dielectric constant | 105 | 110 | 2000 | 110 | 110 |
| Particle size (μm) | 0.1 | 0.2 | 0.2 | 0.2 | 0.2 |
| Part (as solid content) | 40 | 50 | 30 | 50 | 50 |
| Organic Particles |  |  |  |  |  |
| Particle material | polyimide | polyimide | polyimide | epoxy | polyester |
| Part (as solid content) | 60 | 50 | 70 | 50 | 50 |
| Aqueous Dispersion |  |  |  |  |  |
| pH | 4.2 | 4.0 | 4.0 | 4.0 | 4.0 |
| Viscosity (mPa·s) | 10 | 10 | 10 | 10 | 10 |
| Solid content (%) | 7.1 | 8.0 | 6.5 | 8.0 | 8.0 |
| Shelf life | ○ | ○ | ○ | ○ | ○ |
| Film |  |  |  |  |  |
| Thickness (μm) | 20 | 20 | 20 | 20 | 20 |
| Dielectric constant | 7.5 | 12.5 | 15.0 | 12.0 | 12.5 |
| Loss tangent | 0.001 | 0.001 | 0.001 | 0.001 | 0.001 |
| Moist heat resistance | ○ | ○ | ○ | ○ | ○ |
| Volume resistivity (Ω·cm) | $10^{15}$ | $10^{14}$ | $10^{14}$ | $10^{13}$ | $10^{13}$ |

TABLE 2

|  | Example 6 | Example 7 | Comparative Example 1 | Comparative Example 2 |
|---|---|---|---|---|
| Inorganic Particles |  |  |  |  |
| Particle material | $BaTiO_3$ | $BaTiO_3$ | $TiO_2$ | $TiO_2$ |
| Dielectric constant | 2000 | 2000 | 105 | 105 |
| Particle size (μm) | 0.6 | 0.6 | 0.1 | 0.1 |
| Part (as solid content) | 80 | 90 | 100 | 40 |
| Organic Particles |  |  |  |  |
| Particle material | polyimide | polyimide | — | polyimide |
| Part (as solid content) | 20 | 10 | — | 60 |
| Aqueous Dispersion |  |  |  |  |
| pH | — | — | — | — |
| Viscosity (mPa·s) | 10 | 10 | — | 1000 |
| Solid content (%) | 12.5 | 12.5 | — | 20 |
| Shelf life | ○ | ○ | ○ | X |
| Film |  |  |  |  |
| Thickness (μm) | 20 | 20 | — | 20 |
| Dielectric constant | 45 | 40 | — | 9.8 |
| Loss tangent | 0.001 | 0.001 | — | 0.001 |
| Moist heat resistance | ○ | ○ | — | X |
| Volume resistivity (Ω·cm) | $10^{14}$ | $10^{14}$ | $10^{14}$ | $10^{14}$ |

As shown in Tables 1 and 2, the aqueous dispersions of Examples 1-7 all exhibited excellent shelf life, and the films formed by electrodeposition from the aqueous dispersions all had satisfactory electrical properties. In Examples 1-3 and Examples 6 and 7 that used polyimides as the organic particles, films with particularly high volume resistivity were obtained.

On the other hand, Comparative Example 1 which was an aqueous dispersion containing no organic particles was unable to form a film, while Comparative Example 2 which comprised inorganic particles added to a resin varnish lacked shelf life.

The invention claimed is:

1. A high dielectric constant film prepared by a process, comprising:

electrodepositing a film from an aqueous dispersion comprising inorganic particles comprised of a compound selected from the group consisting of barium titanate, lead titanate, bismuth titanate, magnesium titanate and neodymium titanate, having a mean particle size of no greater than 1 μm and a dielectric constant of at least 30, and organic particles comprised of either or both of a polymerizable compound and a polymer, wherein said organic particles have a charge on the particle surfaces and fulfill at least one of the following conditions (i) and (ii)

(i) said organic particles are composite particles of (A) organic solvent-soluble polyimide and (B) hydrophilic polymer, (ii) said organic particles comprise composite particles of (C) polyamic acid and (D) hydrophobic compound.

2. The high dielectric constant film according to claim 1, wherein said polymerizable compound is a compound having a polymerizable group and is selected from the group consisting of precursor compounds that have not been fully cured, polymerizable oligomers and monomers.

3. The high dielectric constant film according to claim 1, wherein the dielectric constant of said film is 6 or greater.

4. The high dielectric constant film according to claim 1, wherein the volume ratio of said inorganic particles to said organic particles ranges from 5/95 to 80/20.

5. The high dielectric constant film according to claim 1, wherein the hydrophilic polymer (B) contains at least one functional group selected from the group consisting of amino, carboxyl, hydroxyl, sulfonic acid groups and amido groups.

6. The high dielectric constant film according to claim 1, wherein the hydrophilic polymer (B) has a solubility in water at 20° C. of at least 0.01 g/100 g.

7. The high dielectric constant film according to claim 1, wherein the hydrophobic compound (D) has a solubility in water at 20° C. of less than 0.05 g/100 g.

8. The high dielectric constant film according to claim 1, wherein said aqueous dispersion further comprises at least one organosilane having the formula:

$$(R^1)_n Si(OR^2)_{4-n} \qquad (1)$$

wherein $R^1$ is hydrogen or a monovalent organic group of 1-8 carbons, $R^2$ is an alkyl group 1-5 carbons, an acyl group of 1-6 carbons or a phenyl group, wherein $R^1$ and $R^2$ may be the same or different, and n is an integer of 1 or 2, hydrolysates of said organosilane compound in which a portion or all of the hydrolysable groups in said organosilane have been hydrolyzed, or partial condensates of said organosilane in which said hydrolysate has been partially dehydrated and condensed.

9. An electronic part having a high dielectric constant film that is prepared by a process, comprising:
electrodepositing a film from an aqueous dispersion comprising inorganic particles comprised of a compound selected from the group consisting of barium titanate, lead titanate, bismuth titanate, magnesium titanate and neodymium titanate and, having a mean particle size of no greater than 1 μm and a dielectric constant of at least 30, and organic particles comprised of either or both of a polymerizable compound and a polymer, wherein said organic particles have a charge on the particle surfaces and fulfill at least one of the following conditions (i) and (ii)
(i) said organic particles are composite particles of (A) organic solvent-soluble polyimide and (B) hydrophilic polymer,
(ii) said organic particles comprise composite particles of (C) polyamic acid and (D) hydrophobic compound.

10. The electronic part according to claim 9, wherein said polymerizable compound is a compound having a polymerizable group and is selected from the group consisting of precursor compounds that have not been fully cured, polymerizable oligomers and monomers.

11. The electronic part according to claim 9, wherein the dielectric constant of said high dielectric constant film is 6 or greater.

12. The electronic part according to claim 9, wherein the volume ratio of said inorganic particles to said organic particles ranges from 5/95 to 80/20.

13. The high dielectric constant film according to claim 9, wherein the hydrophilic polymer (B) contains at least one functional group selected from the group consisting of amino, carboxyl, hydroxyl, sulfonic acid groups and amido groups.

14. The high dielectric constant film according to claim 9, wherein the hydrophilic polymer (B) has a solubility in water at 20° C. of at least 0.01 g/100 g.

15. The high dielectric constant film according to claim 9, wherein the hydrophobic compound (D) has a solubility in water at 20° C. of less than 0.05 g/100 g.

* * * * *